United States Patent [19]

Seward, III et al.

[11] 4,086,089
[45] Apr. 25, 1978

[54] METHOD FOR PRODUCING TRI-COLOR SCREENS FOR TELEVISION PICTURE TUBES

[75] Inventors: Thomas Philip Seward, III; Brent Merle Wedding, both of Corning, N.Y.

[73] Assignee: Corning Glass Works, Corning, N.Y.

[21] Appl. No.: 778,383

[22] Filed: Mar. 17, 1977

[51] Int. Cl.$^2$ .......... G03C 5/04; G03C 5/00; G03C 7/00; G03C 15/00
[52] U.S. Cl. .......... 96/27 R; 96/34; 96/36.1; 96/38.3; 65/30 R; 65/33; 65/DIG. 2; 106/52; 106/DIG. 6; 29/25.17; 354/1
[58] Field of Search .......... 96/36.1, 27 R, 34, 38.3; 29/25.17; 354/1; 65/DIG. 2, 30 R, 33; 106/52, DIG. 6

[56] References Cited

U.S. PATENT DOCUMENTS

| | | | |
|---|---|---|---|
| 2,825,634 | 3/1958 | Rindone | 65/30 R X |
| 3,173,850 | 3/1965 | Hood | 65/DIG. 2 |
| 3,615,459 | 10/1971 | Kaplan | 96/36.1 |
| 3,642,651 | 2/1972 | Marboe et al. | 65/32 X |
| 3,905,791 | 9/1975 | Plumat et al. | 65/32 X |
| 3,932,183 | 1/1976 | Fisher et al. | 96/34 X |
| 3,955,981 | 5/1976 | Stackniak | 96/36.1 |
| 4,019,905 | 4/1977 | Tomita et al. | 96/36.1 |
| 4,021,239 | 5/1977 | Ogawa | 96/36.1 X |
| 4,032,342 | 6/1977 | Strik | 96/36.1 |

*Primary Examiner*—Richard V. Fisher
*Assistant Examiner*—Frank W. Miga
*Attorney, Agent, or Firm*—Clinton S. Janes, Jr.; Clarence R. Patty, Jr.

[57] ABSTRACT

The present invention is directed to a method for producing patterned color-triad arrays in glass for use in color television picture tubes, such arrays being capable of acting as spectrally-selective filters and to provide the desired color information when the television tube is operating. The color-triad arrays are produced by sequentially or simultaneously exposing a polychromatic glass through an electron shadow mask to high energy or actinic radiation and thereafter following the heat treatment and re-exposure practice known to develop colors within polychromatic glass. The filtering action provided by the color triads integrally present within the glass can enhance the contrast of the color image produced. Also, the presence of the color triads in the glass permits the use of a single "white" phosphor, rather than a red, a green and a blue phosphor as are presently used in the conventional color television picture tube.

38 Claims, 6 Drawing Figures

U.S. Patent  April 25, 1978  4,086,089 ns for Television Picture Tubes

BACKGROUND OF THE INVENTION

Customarily, cathode ray tubes utilized as color television picture tubes employ a color screen in combination with a compatible grid or other apertured structure such as the shadow mask type construction. The screen, which is normally disposed on the inner surface of the face panel of the tube, is composed of a large number of dot or slot-like formations of electron-responsive green, blue, and red cathodoluminescent phosphor materials arranged in a specifically-defined pattern. The respective cathodoluminescent groupings (frequently termed color triads) constituting the patterned screen are formed in accordance with the number of electron guns to be utilized in the subject tube and with the respective apertured shadow mask employed.

To provide a picture of high resolution, a very large number of the color triads is required which must be set in the proper pattern. Therefore, the process for forming the pattern of color triads must be one which is capable of accurately forming discrete configurations. One example of a conventional process involves a photoprinting technique wherein the inner surface of the face panel, which has a coating of a light sensitive substance with a desired cathodoluminescent phosphor material contained therewithin, is exposed to a specific controlled directional source of light, the beams of which pass through the apertures in the adjacently-positioned mask to impinge upon the screen coating therebeneath. Subsequent etching of the screen produces the first cathodoluminescent pattern consisting of a spaced array of phosphor dots or slots capable of a particular color cathodoluminescence. That process is sequentially repeated with the other color cathodoluminescent phosphor materials to complete the formation of the tri-color screen. Thus, three separate coatings and exposures thereof are required. In the exposure of each color portion of the screen, the directional source of light is appropriately offset during the exposure operation to provide individual color emitting cathodoluminescent material patterns which are discretely spaced apart from one another such as to form a repetitive plurality of color triads constituting the screen.

Conventionally, the shadow mask is of a foraminous nature such that the resultant screen on the inner surface of the viewing panel is comprised of oriented triads of green, blue, and red phosphor dots or slots. Since the color spots are photodisposed by light beamed through the foraminous mask, the spots are desirably in registry or alignment along the electron beam paths with the apertures of the shadow mask.

In a color picture tube there is a trade-off between picture contrast and brightness. Contrast is reduced as the ambient light level is increased. For example, some television sets produce a picture which is scarcely visible in the presence of sunlight. The reason underlying that phenomenon is the fact that white light is reflected from the phosphor spots, thereby mixing unwanted colors with the light emitted from the phosphor, as well as reducing the light-to-dark ratio (contrast). In an effort to decrease that effect, a neutral gray tint is customarily incorporated in the panel glass.

However, it has been recognized that a much better solution to the problem would be to apply a spectrally-selective filter to the face panel in front of the phosphor, e.g., a blue filter in front of the blue phosphor and a red filter in front of the red phosphor. Hence, if the above-described three-phosphor triads were applied in registry with a corresponding three-color filter array, the perceived amount of light reflected from the red and blue phosphor spots would be reduced significantly.

A second utility that can result from the development of color-triad arrays in the face plate of a color television tube is the capability of employing a single "white" phosphor coating and using the color-triad arrays to produce the desired color information. Such a process would eliminate the costly and complex conventional three-step method described above for applying the three-phosphor triad.

OBJECTIVES OF THE INVENTION

The primary objective of the invention is to provide a method for producing patterned color-triad arrays in glass for use in television picture tubes.

A complementary objective is to provide a glass face plate for a color television tube having patterned color-triad arrays present therein which can act as spectrally-selective filters and to produce the desired color information when the television tube is operating.

SUMMARY OF THE INVENTION

We have discovered that those objectives can be achieved through the proper treatment of selected photosensitive glass compositions from the types generally described in U.S. Ser. No. 646,259, filed Jan. 2, 1976 by J. E. Pierson and S. D. Stookey now U.S. Pat. No. 4,017,318 issued Apr. 12, 1977. That application discloses two general methods for making photosensitive colored glasses or polychromatic glasses, as they have also been termed, each method contemplating a series of irradiation and heat treating steps. As described therein, the base compositions of the operable glasses can vary widely but each must include silver, an alkali metal oxide which is most preferably $Na_2O$, fluoride, and at least one halide selected from the group of chloride, bromide, and iodide. The glasses are irradiated with high energy or actinic radiations selected from the group of high velocity electrons, X-radiations, and ultra-violet radiations having wave lengths within the range of about 2800A–3500A. The heat treatments comprise exposures to temperatures between about the transformation range of the glass up to about the softening point thereof. When ultraviolet radiation constitutes the sole actinic radiation, $CeO_2$ is a required component of the glass composition.

In the first inventive method disclosed therein, the glass article is initially subjected to high energy or actinic radiation which develops a latent image in the glass. The intensity and length of this exposure determines the final color which will be produced in the glass. Thus, the least amount of exposure yields a green color, followed by blue, violet, red, orange, and yellow as the time and/or intensity is increased. Subsequently, the glass article is given a heat treatment which causes the precipitation of colloidal silver particles in the glass which act as nuclei. Where the desired final product is to be transparent, the heat treatment will be carried out for only so long as to effect the development of colloidal silver nuclei and to cause the growth thereon of extremely small microcrystals of alkali metal fluoride-silver halide, e.g., NaF + (AgCl and/or AgBr and/or AgI). The nucleated glass is then cooled to a temperature at least 25° C. below the strain point of the glass and all the way to room temperature, if desired. Thereafter, the glass article is again subjected to high energy or actinic radiations. This second exposure intensifies the color, the identity of which was determined by the parameters of the first exposure. Finally, the glass article is reheated to a temperature between about the transformation range and the softening point of the glass to develop the color in the glass. It is conjectured that this second heat treatment causes submicroscopic particles of metallic silver to be precipitated as discrete colloidal particles and/or deposited on the surface and/or within the alkali metal fluoride-silver halide microcrystals.

The mechanism of the color phenomenon was not totally understood. Nevertheless, electron microscopic study of the microstructure has led to the conclusion that the amount of silver precipitated and the geometry thereof along with, perhaps, the refractive index of the crystals, determine the color produced. However, because the colors can be attained with very low concentrations of silver and exhibit characteristics similar to interference colors, it was hypothesized that at least one of the following three circumstances is present: (1) discrete colloidal particles of silver less than about 200A in the smallest dimension; (2) metallic silver deposited within alkali metal fluoride-silver halide microcrystals, the silver-containing portion of the microcrystals being less than about 200A in the smallest dimension; and (3) metallic silver deposited upon the surface of said microcrystals, the silver-coated portion of the microcrystals being less than about 200A in the smallest dimension. The concentration of the microcrystals will be at least 0.005% by volume and, to insure transparency, the concentration will not exceed about 0.1% by volume and the size will not exceed about 0.1 micron in diameter.

A further observation was that the heat treatment of each exposure to high energy or actinic radiation may consist of a series of heatings and coolings instead of a single treatment as outlined above. Such practice does not greatly alter the color hue developed but can improve color intensity.

The second general method disclosed in the above application leads to glasses exhibiting a single color, the identity of which can be varied over the full range of the visible spectrum. The method comprehends four steps. First, a glass-forming batch similar to that delineated above as being operable in the first method, but also containing a thermoreducing agent, is melted and shaped into a glass article. Second, the glass article is subjected to a temperature between about the transformation range of the glass and the softening point thereof for a period of time sufficient to effect reduction of part of the silver ion content to metallic silver and thereby instigate nucleation and growth of alkali metal fluoride-silver halide microcrystals. Third, the nucleated glass is cooled and exposed to high energy or actinic radiations. Fourth, the glass article is reheated to a temperature between about the transformation range of the glass and the softening point thereof to generate precipitation of submicroscopic particles of silver, either as discrete colloidal particles and/or deposited on the surface and/or within the alkali metal fluoride-silver halide microcrystals.

The sequence of colors developed is similar to that resulting from the first method. Thus, the least thermal reduction of the glass will produce a green color, whereas the most extensive will yield a yellow color.

U.S. application Ser. No. 778,160, filed by Joseph Ference, discloses an improvement upon Ser. No. 646,259, supra now U.S. Pat. No. 4,017,318 issued Apr. 12, 1977. The invention therein is founded upon the discovery that, where the nucleated glass is exposed to high energy or actinic radiations while the glass is at an elevated temperature, viz., between about 200°–410° C., the time required for color development is shortened very extensively and the colors appear to be purer and more vivid. Especially desirable properties are noted as being obtained where the glass compositions consist essentially, in weight percent on the oxide basis as calculated from the batch, of about 10–20% $Na_2O$, 0.0005–0.3% Ag, 1–4% F, an amount of at least one halide selected from the group consisting of Cl, Br, and I at least sufficient to react stoichiometrically with the Ag, but not more than a total of about 3%, and the remainder $SiO_2$.

We have found that patterned color-triad arrays can be produced in glass suitable for use in color television picture tubes. Described in the broadest terms, the inventive method comprises using an appropriate electron shadow mask (dot or slot-like apertures) as the "negative" and exposing glass having a composition within the preferred ranges of Ser. No. 778,160, supra, to high energy or actinic radiation. The shadow mask has one hole per triad. Three exposures are made utilizing the proper time, intensity, wave length of radiation, and beam registry conditions to produce the color-triad arrays. Subsequent heat treatment and re-exposure serve to bring out the colors.

Dots or slots having good registry can be produced by placing the shadow mask in contact with the glass and moving the glass a distance equal to about one-third of the hole separation after each exposure. Another operable embodiment of the method involves placing the mask at a uniform distance from the glass and thereafter providing three exposures using well-collimated high energy or actinic radiation incident at the proper angles to yield the required dot or slot locations.

Inasmuch as exposure through a shadow mask having apertures of standard size may result in dots or slots of inadequate sizes for efficient use of phosphor power, it is preferred that the mask have somewhat enlarged apertures on standard centers. It can be appreciated that a mask having actual holes therein is not required since a suitably transparent glass with the mask prepared in an opaque layer by photoetching techniques would be equally useful.

In the broadest terms, the present invention comprehends subjecting a photosensitive polychromatic glass to three different exposures to high energy or actinic radiation, one for each of three different shadow mask positions, and thereafter developing three sets of color dots or slots via subsequent heat treatments and exposures. The cited exposures can be undertaken sequentially or simultaneously. At the conclusion of the color development, the spaces between the dots or slots remains clear.

In a modification of the basic method, the entire photosensitive polychromatic glass is subjected to the proper exposure to produce green dots or slots and then subsequently further exposed either simultaneously or sequentially to develop blue and red spots. The final glass would then also have an overall green background.

The instant invention is especially operable with the glass compositions recited in Ser. No. 778,160, supra, as being preferred therefor, viz., glasses consisting essentially, in weight percent on the oxide basis as calculated from the batch, of about 10–20% $Na_2O$, 0.0005–0.3% Ag, 1–4% F, an amount of at least one halide selected from the group consisting of Cl, Br, and I at least sufficient to react stoichiometrically with the Ag, but not more than a total of about 3%, and the remainder $SiO_2$. Where ultra-violet radiation constitutes the actinic radiation, 0.01–0.2% $CeO_2$ will be included. The crystal content will be at least about 0.005% by volume and, because transparency is desired, the concentration of crystals will not exceed about 0.1% by volume and the size thereof will not exceed about 0.1 micron in diameter. Also, to insure transparency, the Ag content will preferably be held below about 0.1%, the content of F below about 3%, and the sum of the other halides below about 2%. The inclusion of up to 18% ZnO and up to 10% $Al_2O_3$ can be useful in improving the melting and forming characteristics of the glass as well as modifying the chemical and physical properties thereof. Hence, at least one of those components is customarily contained in the composition.

DESCRIPTION OF PREFERRED EMBODIMENTS

The following composition, expressed in parts by weight on the oxide basis as calculated from the batch, represents a glass which is operable in the present invention. Because it is not known with which cation(s) the halides are combined, they are merely tabulated as halide, in accordance with conventional glass analysis practice. Furthermore, inasmuch as the silver content is extremely small, it is simply reported as Ag. Finally, since the total of the individual constituents closely approximates 100, for practical purposes each weight listed may be deemed to be essentially equivalent to a weight percent.

The batch ingredients may comprise any material, either the oxide or other compound, which, when melted with the remaining components, will be converted into the desired oxide in the proper proportions. The halides are customarily added as alkali metal halides.

During the melting process, up to as much as 50% by weight of the halide constituents and up to about 30% by weight Ag may be volatilized away. Nevertheless, the addition of extra amounts of those components to compensate for such losses is well within the technical skill of the glass technologist.

Whereas the following description utilized a laboratory scale melting experiment, it must be recognized that the production of television tube face plates would require large-scale commercial melts. The recited compositions would be operable for such.

Each batch set out below was compounded, the ingredients thereof ballmilled together to assist in achieving a homogeneous melt, and then melted at about 1450° C. for about four to six hours with stirring. Discs about 3 inches in diameter and about 4–5 mm in thickness were pressed and then transferred to an annealer operating at about 460° C. After annealing the top and bottom sides of the disc were ground and polished to an overall thickness of about 1.5 mm.

| | | |
|---|---|---|
| $SiO_2$ | 72.0 | 72.0 |
| $Na_2O$ | 16.2 | 16.2 |
| ZnO | 5.0 | 5.0 |
| $Al_2O_3$ | 6.9 | 6.8 |
| F | 2.5 | 2.8 |
| $CeO_2$ | 0.05 | 0.1 |
| Br | 1.1 | 0.4 |
| Ag | 0.01 | 0.03 |
| SnO | 0.05 | 0.09 |
| $Sb_2O_3$ | 0.2 | 0.3 |

FIGS. 1–6 record a process carried in the laboratory for producing color triads in the above-mentioned disc sample which could be scaled up to be useful with commercial television face plates. The process must be considered as illustrative only and not as limitative of the invention. Hence, as noted previously in the Summary of the Invention, there are several methods by which the color dots or slots can be imprinted into the glass.

Figure 1:
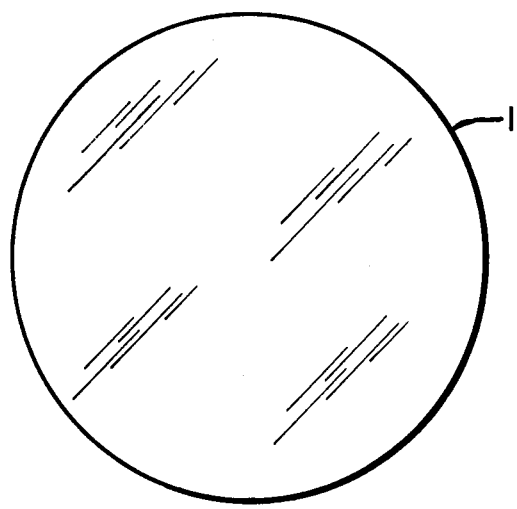
Figure 2:
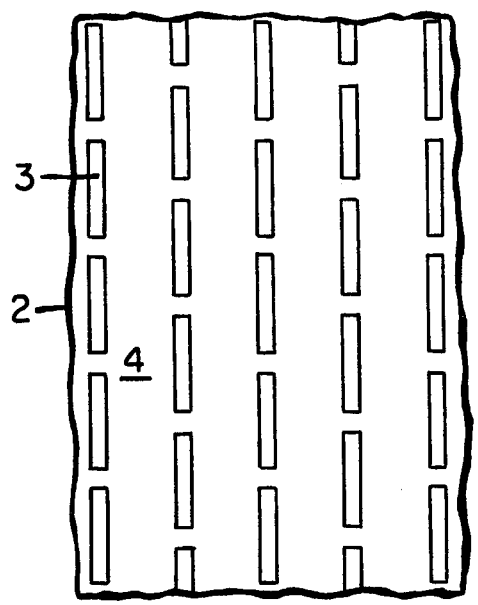
Figure 3:
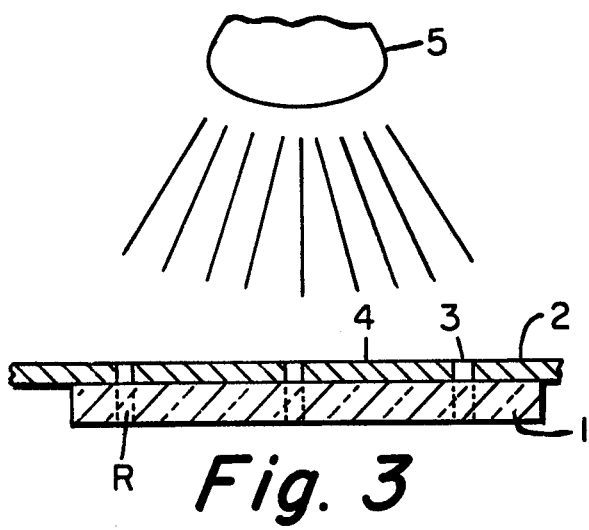
Figure 4:
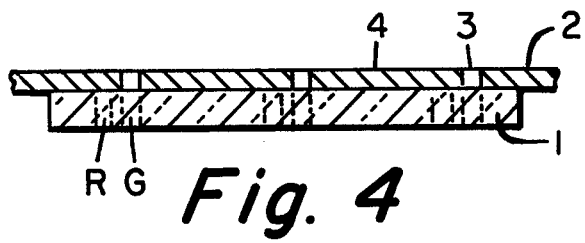
Figure 5:
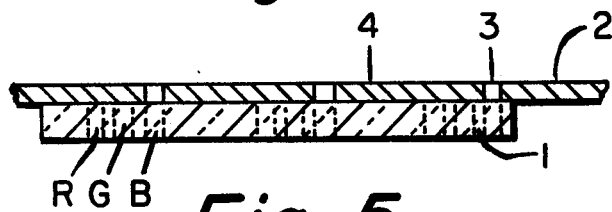
Figure 6:
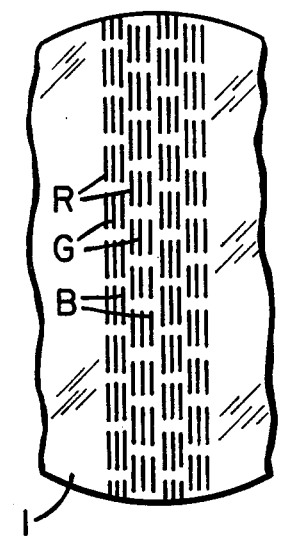

FIG. 1 depicts disc 1 and FIG. 2 represents a metal grid or screen 2 with slot-shaped apertures 3 in staggered relationship to each other having a width slightly less than one-third the width of the metal web 4 between the slots. FIG. 3 illustrates metal grid 2 being placed in contact with the top surface of disc 1 and the composite unit being irradiated with a source of actinic radiation 5, the beam therefrom passing through slots 3 onto disc 1. FIG. 4 shows metal grid 2 horizontally displaced along the top surface of disc 1 such that when the composite unit is again exposed to a source of actinic radiation 5, the beam therefrom passing through slots 3 will impinge upon disc 1 slightly spaced apart from the area originally exposed. FIG. 5 represents grid 2 further horizontally displaced along the top surface of disc 1, the amount of displacement being essentially the same as that carried out in FIG. 4. Exposure of the composite unit to a source of actinic radiation 5 causes the beam to pass through slots 3 and strike disc 1 in an area spaced apart from the exposed area of FIG. 4 at a distance essentially the same as that existing between the exposed areas of FIGS. 3 and 4. The lengths of the exposures determine the color produced, shown in FIGS. 3–5 as red (R), blue (B), and green (G). FIG. 6 illustrates, in part, the pattern of color-triad slots that is produced when metal grid 2 is removed and disc 1 is subjected to heat treatment and further exposure.

In carrying out the practice as outlined in FIGS. 1–6, a 2500 watt mercury vapor lamp system having substantial intensity at a wave length of about 3000A supplied a source of ultra-violet radiation. Other sources of ultra-violet radiation can be employed, of course, and, as has been explained above, high energy electrons and X-radiations are also operable to secure the necessary photoreduction of the silver ions.

As depicted in FIGS. 3–5, the composite unit of metal grid 2 and disc 1 was placed in the focal plane of the ultra-violet lamp system 5. An exposure of 105 seconds was used for the red slot, 60 seconds for the blue slot, and 30 seconds for the green slot. Thereafter, the metal grid 2 was removed and disc 1 was placed within an electrically-heated furnace and the temperature therein raised at about 10° C./minute to 510° C. After about 60 minutes the disc was cooled to about ambient or room temperature. The disc was then placed within an electrically-heated oven and exposed to ultra-violet lamp 5 for about two hours while the temperature of the disc was maintained at about 300° C. Triads of vivid red, blue, and green colors were obtained in the disc as depicted in FIG. 6.

The first heat treatment was carried out above the transformation range of the glass, but below the softening point thereof, whereas the second exposure and heat treatment were conducted simultaneously at a temperature below the transformation range of the glass. Thus, the second exposure and heat treatment were undertaken in accordance with the method disclosed in Ser. No. 778,160, supra. (The transformation range has been defined as that temperature at which a liquid melt has become an amorphous solid, that temperature being deemed to lie in the vicinity of the annealing point of the glass.)

It will be appreciated, of course, that the flux of exposure to high energy or actinic radiation, i.e., the intensity and/or time of the exposure, required to develop a latent image leading to the subsequent production of each color is dependent upon the glass composition, as is the heat treatment. However, the determination of those necessary values is well-within the technical ingenuity of the worker or ordinary skill in the art.

Likewise, various overall modifications in exposure-heat treatment sequences are also operable. For example, the first exposure can be undertaken at a temperature between about 200°–410° C. This permits the exposure time to be substantially reduced. Thereafter, the glass is heat treated at a temperature between the transformation range and the softening point thereof. Further, after the first sequence of exposure and heat treatment, the glass can be cooled, again exposed to high energy or actinic radiation, and thereafter heated to a temperature between the transformation range and the softening point of the glass to bring out the colors.

Moreover, it will be recognized that the color triads can be developed in the face plate of the color television tube or, if desired, the tri-color screen can be developed in a separate glass sheet which is secured to the face plate to produce a composite unit. However, for purposes of this invention, that embodiment of the invention will be deemed to be equivalent to developing the screen on the face plate itself, since the basic method of producing the color triads is the same.

We claim:

1. A method for preparing a patterned, integrally-colored, transparent, tri-color glass screen for the face plate of a color television picture tube comprising the steps of:
   (a) forming a glass body suitable as a face plate for a television picture tube or a glass body suitable for attachment to said face plate to form a composite body consisting essentially, in weight percent on the oxide basis as calculated from the batch, of about 10–20% $Na_2O$, 0.0005–0.3% Ag, 1–4% F, an amount of at least one halide selected from the group consisting of Cl, Br, and I at least sufficient to react stoichiometrically with the Ag, but not more than about 3%, and the remainder $SiO_2$;
   (b) placing an appropriate electron shadow mask in contact with said glass body at a position to expose about one-third of the pattern area;
   (c) subjecting said one-third of the pattern area to high energy or actinic radiation for a period of time sufficient to develop a latent image therein leading to the production of a first integral color therein selected from the group of red, green, and blue;
   (d) moving the shadow mask and/or the glass body a distance equal to about one-third of the hole separation in said shadow mask;
   (e) subjecting a second one-third of the pattern area to high energy or actinic radiation for a period of time sufficient to develop a latent image therein leading to the production of a second integral color therein selected from the group of red, green, and blue; which is different from the color produced by step (c)
   (f) moving the shadow mask and/or the glass body another distance equal to about one-third of the hole separation in said shadow mask;
   (g) subjecting a third one-third of the pattern area to high energy or actinic radiation for a period of time sufficient to develop a latent image therein leading to the production of a third integral color therein selected from the group of red, green, and blue; which is different from the colors produced by steps (c) and (e)
   (h) heating said glass article to a temperature between about the transformation range of the glass and the softening point thereof for a sufficient length of time to cause nucleation and growth of microcrystals of alkali metal fluoride containing at least one silver halide selected from the group consisting of silver chloride, silver bromide, and silver iodide in the areas of said latent image;
   (i) subjecting at least said previously-exposed portions of said glass body to high energy or actinic radiation while at least said portions are at a temperature between about 200°–410° C. for a sufficient length of time to cause metallic silver to be deposited as discrete colloidal particles less than about 200A in the smallest dimension, and/or deposited within said microcrystals, the silver-containing part of the microcrystal being less than about 200A in the smallest dimension, and/or deposited on the surface of said microcrystals, the portion of the microcrystal coated with silver being less than about 200A in the smallest dimension, said microcrystals having a concentration of at least 0.005% by volume and causing the integral red, green, and blue coloration; and then
   (j) cooling said glass body to ambient temperature.

2. A method according to claim 1 wherein the silver content of the glass composition will not exceed about 0.1%, the fluoride content of the glass composition will not exceed about 3%, and the total of the remaining halides in the glass composition will not exceed about 2%.

3. A method according to claim 1 wherein said glass composition also contains about 0.01–0.2% $CeO_2$.

4. A method according to claim 1 wherein said glass composition also contains up to 18% ZnO and/or up to 10% $Al_2O_3$.

5. A method according to claim 1 wherein the concentration of said microcrystals in said integrally-colored portions does not exceed about 0.1% by volume and the size thereof does not exceed about 0.1 micron in diameter.

6. A method according to claim 1 wherein said integrally-colored glass body consists of a polychromatic glass.

7. A method according to claim 1 wherein said shadow mask has somewhat enlarged holes on standard centers.

8. A method for preparing a patterned, integrally-colored, transparent, tri-color glass screen for the face plate of a color television picture tube comprising the steps of:
   (a) forming a glass body suitable as a face plate for a television picture tube or a glass body suitable for attachment to said face plate to form a composite body consisting essentially, in weight percent on the oxide basis as calculated from the batch, of about 10–20% $Na_2O$, 0.0005–0.3% Ag, 1–4% F, an amount of at least one halide selected from the group consisting of Cl, Br, and I at least sufficient to react stoichiometrically with the Ag, but not more than about 3%, and the remainder $SiO_2$;

(b) placing an appropriate electron shadow mask in contact with said glass body at a position to expose about one-third of the pattern area;

(c) subjecting said one-third of the pattern area to high energy or actinic radiation for a period of time sufficient to develop a latent image therein leading to the production of a first integral color therein selected from the group of red, green, and blue;

(d) moving the shadow mask and/or the glass body a distance equal to about one-third of the hole separation in said shadow mask;

(e) subjecting a second one-third of the pattern area to high energy or actinic radiation for a period of time sufficient to develop a latent image therein leading to the production of a second integral color therein selected from the group of red, green, and blue; which is different from the color produced by step (c)

(f) moving the shadow mask and/or the glass body another distance equal to about one-third of the hole separation in said shadow mask;

(g) subjecting a third one-third of the pattern area to high energy or actinic radiation for a period of time sufficient to develop a latent image therein leading to the production of a third integral color therein selected from the group of red, green, and blue; which is different from the colors produced by steps (c) and (e)

(h) heating said glass article to a temperature between about the transformation range of the glass and the softening point thereof for a sufficient length of time to cause nucleation and growth of microcrystals of alkali metal fluoride containing at least one silver halide selected from the group consisting of silver chloride, silver bromide, and silver iodide in the areas of said latent image;

(i) subjecting at least said previously-exposed portions of said glass body to high energy or actinic radiation;

(j) heating said glass body to a temperature between about the transformation range of the glass and the softening point thereof for a sufficient length of time to cause metallic silver to be deposited as discrete colloidal particles less than 200Å in the smallest dimension, and/or deposited within said microcrystals, the silver-containing part of the microcrystal being less than about 200Å in the smallest dimension, and/or deposited on the surface of said microcrystals, the portion of the microcrystal coated with silver being less than about 200Å in the smallest dimension said microcrystals having a concentration of at least 0.005% by volume and causing the integral red, green, and blue coloration; and then (k) cooling said glass body to ambient temperature.

9. A method according to claim 8 wherein the silver content of the glass composition will not exceed about 0.1, the fluoride content of the glass composition will not exceed about 3%, and the total of the remaining halides in the glass composition will not exceed about 2%.

10. A method according to claim 8 wherein said glass composition also contains about 0.01–0.2% $CeO_2$.

11. A method according to claim 8 wherein said glass composition also contains up to 18% ZnO and/or up to 10% $Al_2O_3$.

12. A method according to claim 8 wherein the concentration of said microcrystals in said integrally-colored portions does not exceed about 0.1% by volume and the size thereof does not exceed about 0.1 micron in diameter.

13. A method according to claim 8 wherein said integrally-colored glass body consists of a polychromatic glass.

14. A method according to claim 8 wherein said shadow mask has somewhat enlarged holes on standard centers.

15. A method for preparing a patterned, integrally-colored, transparent, tri-color glass screen for the face plate of a color television picture tube comprising the steps of:

(a) forming a glass body suitable as a face plate for a television picture tube or a glass body suitable for attachment to said faceplate to form a composite body consisting essentially, in weight percent on the oxide basis as calculated from the batch, of about 10–20% $Na_2O$, 0.0005–0.3% Ag, 1–4% F, an amount of at least one halide selected from the group consisting of Cl, Br, and I at least sufficient to react stoichiometrically with the Ag, but not more than about 3%, and the remainder $SiO_2$;

(b) placing an electron shadow mask at an appropriate uniform distance from said glass body;

(c) directing collimated high energy or actinic radiation through said mask toward said glass body at the proper angle to expose about one-third of the pattern area for a period of time sufficient to develop a latent image therein leading to the production of a first integral color therein selected from the group of red, green, and blue;

(d) directing collimated high energy or actinic radiation through said mask toward said glass body at the proper angle to expose a second one-third of the pattern area for a period of time sufficient to develop a latent image therein leading to the production of a second integral color therein selected from the group of red, green, and blue; which is different from the color produced by step (c)

(e) directing collimated high energy or actinic radiation through said mask toward said glass body at the proper angle to expose a third one-third of the pattern area for a period of time sufficient to develop a latent image therein leading to the production of a third integral color therein selected from the group of red, green, and blue; which is different from the colors produced by steps (c) and (d)

(f) heating said glass article to a temperature between about the transformation range of the glass and the softening point thereof for a sufficient length of time to cause nucleation and growth of microcrystals of alkali metal fluoride containing at least one silver halide selected from the group consisting of silver chloride, silver bromide, and silver iodide in the areas of said latent image;

(g) subjecting at least said previously-exposed portions of said glass body to high energy or actinic radiation while at least said portions are at a temperature between about 200°–410° C. for a sufficient length of time to cause metallic silver to be deposited as discrete colloidal particles less than about 200A in the smallest dimension, and/or deposited within said microcrystals, the silver-containing part of the microcrystal being less than about 200A in the smallest dimension, and/or deposited on the surface of said microcrystals, the portion of the microcrystal coated with silver being less than about 200A in the smallest dimension, said microcrystals having a concentration of at least 0.005% by volume and causing the integral red, green, and blue coloration; and then (h) cooling said glass body to ambient temperature.

16. A method according to claim 15 wherein the silver content of the glass composition will not exceed about 0.1%, the fluoride content of the glass composition will not exceed about 3%, and the total of the remaining halides in the glass composition will not exceed about 2%.

17. A method according to claim 15 wherein said glass composition also contains about 0.01–0.2% $CeO_2$.

18. A method according to claim 15 wherein said glass composition also contains up to 18% ZnO and/or up to 10% $Al_2O_3$.

19. A method according to claim 15 wherein the concentration of said microcrystals in said integrally-colored portions does not exceed about 0.1% by volume and the size thereof does not exceed about 0.1 micron in diameter.

20. A method according to claim 15 wherein said integrally-colored glass body consists of a polychromatic glass.

21. A method according to claim 18 wherein said shadow mask has somewhat enlarged holes on standard centers.

22. A method according to claim 18 wherein said three initial exposures to collimated high energy or actinic radiation are conducted simultaneously.

23. A method for preparing a patterned, integrally-colored, transparent, tri-color glass screen for the face plate of a color television picture tube comprising the steps of:

(a) forming a glass body suitable as a face plate for a television picture tube or a glass body suitable for attachment to said face plate to form a composite body consisting essentially, in weight percent on the oxide basis as calculated from the batch, of about 10–20% $Na_2O$, 0.0005–0.3% Ag, 1–4% F, an amount of at least one halide selected from the group consisting of Cl, Br, and I at least sufficient to react stoichiometrically with the Ag, but not more than about 3%, and the remainder $SiO_2$;

(b) placing an electron shadow mask at an appropriate uniform distance from said glass body;

(c) directing collimated high energy or actinic radiation through said mask toward said glass body at the proper angle to expose about one-third of the pattern area for a period of time sufficient to develop a latent image therein leading to the production of a first integral color therein selected from the group of red, green, and blue;

(d) directing collimated high energy or actinic radiation through said mask toward said glass body at the proper angle to expose a second one-third of the pattern area for a period of time sufficient to develop a latent image therein leading to the production of a second integral color therein selected from the group of red, green, and blue; which is different from the color produced by step (c)

(e) directing collimated high energy or actinic radiation through said mask toward said glass body at the proper angle to expose a third one-third of the pattern area for a period of time sufficient to develop a latent image therein leading to the production of a third integral color therein selected from the group of red, green, and blue; which is different from that colors produced by steps (c) and (d)

(f) heating said glass body to a temperature between about the transformation range of the glass and the softening point thereof for a sufficient length of time to cause nucleation and growth of microcrystals of alkali metal fluoride containing at least one silver halide selected from the group consisting of silver chloride, silver bromide, and silver iodide in the areas of said latent image; (g) subjecting at least said previously-exposed portion of said glass body to high energy or actinic radiation;

(h) heating said glass body to a temperature between about the transformation range of the glass and the softening point thereof for a sufficient length of time to cause metallic silver to be deposited as discrete colloidal particles less than 200A in the smallest dimension, and/or deposited within said microcrystals, the silver-containing part of the microcrystal being less than about 200A in the smallest dimension, and/or deposited on the surface of said microcrystals, the portion of the microcrystal coated with silver being less than about 200A in the smallest dimension, said microcrystals having a concentration of at least 0.005% by volume and causing the integral red, green, and blue coloration, and then (i) cooling said glass body to ambient temperature.

24. A method according to claim 23 wherein the silver content of the glass composition will not exceed about 0.1%, the fluoride content of the glass composition will not exceed about 3%, and the total of the remaining halides in the glass composition will not exceed about 2%.

25. A method according to claim 23 wherein said glass composition also contains about 0.01–0.2% $CeO_2$.

26. A method according to claim 23 wherein said glass composition also contains up to 18% ZnO and/or up to 10% $Al_2O_3$.

27. A method according to claim 23 wherein the concentration of said microcrystals in said integrally-colored portions does not exceed about 0.1% by volume and the size thereof does not exceed about 0.1 micron in diameter.

28. A method according to claim 23 wherein said integrally-colored glass body consists of a polychromatic glass.

29. A method accoring to claim 23 wherein said shadow mask has somewhat enlarged holes on standard centers.

30. A method according to claim 23 wherein said three initial exposures to collimated high energy or actinic radiation are conducted simultaneously.

31. A method for preparing a patterned, integrally-colored, transparent, tri-color glass screen for the face plate of a color television picture tube, wherein said face plate has an overall green background, comprising the steps of:

(a) forming a glass body suitable as a face plate for a television picture tube or a glass body suitable for attachment to said face plate to form a composite body consisting essentially, in weight percent on the oxide basis as calculated from the batch, of about 10–20% $Na_2O$, 0.0005–0.3% Ag, 1–4% F, an amount of at least one halide selected from the group consisting of Cl, Br, and I at least sufficient to react stoichiometrically with the Ag, but not more than about 3%, and the remainder $SiO_2$;

(b) subjecting said glass body to high energy or actinic radiation for a period of time sufficient to develop a latent image therein leading to the production of an integral green color therein;

(c) placing an electron shadow mask at an appropriate uniform distance from said glass body;

(d) directing collimated high energy or actinic radiation through said mask toward said glass body at the proper angle to expose about one-third of the pattern area for a period of time sufficient to develop a latent image therein leading to the production of a first integral color therein selected from the group of red and blue;

(e) directing collimated high energy or actinic radiation through said mask toward said glass body at the proper angle to expose a second one-third of the pattern area for a period of time sufficient to develop a latent image therein leading to the production of a second integral color therein selected from the group of red and blue; which is different from the color produced by step (d)

(f) heating said glass body to a temperature between about the transformation range of the glass and the softening point thereof for a sufficient length of time to cause nucleation and growth of microcrystals of alkali metal fluoride containing at least one silver halide selected from the group consisting of silver chloride, silver bromide, and silver iodide in the areas of said latent image;

(g) subjecting said glass body to high energy or actinic radiation;

(h) heating said glass body to a temperature between about the transformation range of the glass and the softening point thereof for a sufficient length of time to cause metallic silver to be deposited as discrete colloidal particles less than 200A in the smallest dimension, and/or deposited within said microcrystals, the silver-containing part of the microcrystal being less than about 200A in the smallest dimension, and/or deposited on the surface of said microcrystals, the portion of the microcrystal coated with silver being less than about 200A in the smallest dimension, said microcrystals having a concentration of at least 0.005% by volume and causing the integral red, green, and blue coloration; and then (i) cooling said glass body to ambient temperature.

32. A method according to claim 31 wherein the silver content of the glass composition will not exceed about 0.1%, the fluoride content of the glass composition will not exceed about 3%, and the total of the remaining halides in the glass composition will not exceed about 2%.

33. A method according to claim 31 wherein said glass composition also contains about 0.01–0.2% $CeO_2$.

34. A method according to claim 31 wherein said glass composition also contains up to 18% SnO and/or up to 10% $Al_2O_3$.

35. A method according to claim 31 wherein the concentration of said microcrystals in said integrally-colored portion does not exceed about 0.1% by volume and the size thereof does not exceed about 0.1 micron in diameter.

36. A method according to claim 31 wherein said integrally-colored glass body consists of a polychromatic glass.

37. A method according to claim 31 wherein said shadow mask has somewhat enlarged holes on standard centers.

38. A method according to claim 31 wherein said two exposures to collimated high energy or actinic radiation are conducted simultaneously.

* * * * *